(12) United States Patent
Walz et al.

(10) Patent No.: US 10,972,250 B2
(45) Date of Patent: Apr. 6, 2021

(54) DEVICE AND METHOD FOR CORRECTING AT LEAST ONE TRANSMISSION PARAMETER

(71) Applicant: Robert Bosch GmbH, Stuttgart (DE)

(72) Inventors: Michel Walz, Eningen (DE); Frank Schou, Ditzingen (DE); Joerg Conradt, Kornwestheim (DE); Marlon Ramon Ewert, Untergruppenbach (DE); Rainer Gschwind-Schilling, Rutesheim (DE); Mustafa Ajanovic, Sindelfingen (DE); Kevin Haist, Ditzingen (DE); Michael Haug, Stuttgart (DE); Guenter Weiss, Walheim (DE); Daniela Bommer, Leonberg (DE); Darko Rozic, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/753,063

(22) PCT Filed: Sep. 19, 2018

(86) PCT No.: PCT/EP2018/075275
§ 371 (c)(1),
(2) Date: Apr. 2, 2020

(87) PCT Pub. No.: WO2019/068460
PCT Pub. Date: Apr. 11, 2019

(65) Prior Publication Data
US 2020/0295916 A1    Sep. 17, 2020

(30) Foreign Application Priority Data
Oct. 5, 2017 (DE) ..................... 10 2017 217 723.3

(51) Int. Cl.
*H04L 7/00* (2006.01)
*H04L 7/08* (2006.01)
(Continued)

(52) U.S. Cl.
CPC ................ *H04L 7/08* (2013.01); *G08C 25/00* (2013.01); *H03K 5/19* (2013.01); *H03K 5/26* (2013.01); *H04L 7/0012* (2013.01)

(58) Field of Classification Search
CPC ......... H04L 7/08; H04L 7/0012; G08C 25/00; H03K 5/19; H03K 5/26
(Continued)

(56) References Cited

U.S. PATENT DOCUMENTS

2007/0177532 A1    8/2007  Kurachi et al.
2020/0236517 A1*   7/2020  Matsunaga ........... H04L 7/0008

FOREIGN PATENT DOCUMENTS

DE    10 2012 203 664 A1    9/2013
EP          0 306 059 A2     3/1989
WO         2013/083560 A1    6/2013

OTHER PUBLICATIONS

International Search Report corresponding to PCT Application No. PCT/EP2018/075275, dated Jan. 7, 2019 (German and English language document) (7 pages).
(Continued)

*Primary Examiner* — Zewdu A Kassa
(74) *Attorney, Agent, or Firm* — Maginot, Moore & Beck LLP (57) ABSTRACT

A method corrects at least one transmission parameter for data transmission between a sensor unit and a control unit. A sensor timing signal is generated by a sensor oscillator with a predetermined period. The at least one transmission parameter is determined on the basis of the sensor timing signal. A reference timing signal is generated by a reference
(Continued)

oscillator with a predefined reference period. The sensor timing signal is compared with the reference timing signal. A deviation of a current period of the sensor timing signal from a reference period is determined on the basis of the comparison. The at least one transmission parameter is corrected on the basis of the determined deviation.

15 Claims, 3 Drawing Sheets

(51) Int. Cl.
  *G08C 25/00* (2006.01)
  *H03K 5/19* (2006.01)
  *H03K 5/26* (2006.01)

(58) Field of Classification Search
  USPC ....... 375/368, 367, 360, 359, 254, 295, 316, 375/219
  See application file for complete search history.

(56) References Cited

OTHER PUBLICATIONS

Bosch et al., Peripheral Sensor Interface for Automotive Applications, Technical Specification, V2.1, Oct. 8, 2012 (62 pages).
Nguyen, Thang et al., Verification Methodology of Sophisticated Automotive Sensor Interfaces Integrated in Mode System-on-Chip Airbag System, IECON 2013—39th Annual Conference of the IEEE Industrial Electronics Society, IEEE, Nov. 10, 2013, pp. 2335-2340 (6 pages).

* cited by examiner

DEVICE AND METHOD FOR CORRECTING AT LEAST ONE TRANSMISSION PARAMETER

This application is a 35 U.S.C. § 371 National Stage Application of PCT/EP2018/075275, filed on Sep. 19, 2018, which claims the benefit of priority to Serial No. DE 10 2017 217 723.3, filed on Oct. 5, 2017 in Germany, the disclosures of which are incorporated herein by reference in their entirety.

The disclosure is based on a method for correcting at least one transmission parameter for data transmission between a sensor unit and a control unit. The subject matter of the disclosure is also a device for carrying out such a method.

BACKGROUND

Peripheral sensor interface 5 (PSI5) is an open standard. On the basis of the previous PASO protocol, the PSI5 standard supports applications in which up to four sensors per bus node can be interrogated in different configurations by a control unit. Bidirectional communication for sensor configuration and diagnosis is also provided.

In airbag systems, for example data from pressure sensors or acceleration sensors is evaluated via current-modulated two-wire buses which communicate with the control unit via a Manchester-encoded protocol. The PSI5 standard also defines possible operating modes. They are firstly differentiated into synchronous and asynchronous operating modes. In the case of the synchronous operating modes, depending on the connection of the sensors to the control unit there are three operating modes: parallel BUS mode in which the sensors are connected in parallel, universal BUS mode in which the sensors are connected in serial fashion and daisy chain BUS mode. Combined with other parameters, such as the total number of time slots, data rate, data word length, parity/CRC monitoring, the PSI5 standard permits different implementation possibilities. The use of a 10 bit data word length is widespread.

Owing to oscillator clock tolerances at the sensor, the number of bits which can be transmitted within a PSI5 communication mode is limited. For example, 10 bit sensor data can be transmitted within a 125 k communication mode in three different communication slots, even if the oscillator clock of the sensor can deviate by ±5% over its service life. However, in known methods it is not possible to communicate with three bus users within four communicate slots in the 16 bit mode at 189 k if there is an oscillator deviation of ±5% since otherwise data collisions can occur on the bus.

SUMMARY

The method for correcting at least one transmission parameter for data transmission between a sensor unit and a control unit and the device for correcting at least one transmission parameter for data transmission between a sensor unit and a control unit each have the advantage that by correcting at least one transmission parameter, fault-free transmission with the PSI5 standard can be made possible in any desired communication modes over the service life of the vehicle even if the sensor oscillator clock can deviate over the service life of the vehicle. Therefore, embodiments of the disclosure permit satisfactory data transmission by means of the PSI5 standard even when the oscillator clock of the sensor unit is disrupted to a certain extent, and certain, chronologically very tight PSI5 communication modes are to be implemented. This can advantageously improve safety in road traffic, since sensor units with a defect sensor oscillator can nevertheless still transmit data within a specific range. As a result, incorrect failures to trigger can be minimized.

The embodiments of the disclosure make available a method for correcting at least one transmission parameter for data transmission between a sensor unit and a control unit. A sensor oscillator generates a sensor clock signal with a predefined period length, wherein the at least one transmission parameter is determined on the basis of the sensor clock signal. In addition, a reference clock signal which is generated by a reference oscillator with a predefined reference period length is received. In this context, the sensor clock signal is compared with the reference clock signal, wherein a deviation of the current period length of the sensor clock signal from a setpoint period length is determined on the basis of the comparison, and wherein the at least one transmission parameter is corrected on the basis of the determined deviation.

In addition, a device for correcting at least one transmission parameter for data transmission between a sensor unit and a control unit is proposed. A sensor oscillator generates and outputs a sensor clock signal with a predefined period length, wherein the at least one transmission parameter is determined on the basis of the sensor clock signal. A reference oscillator generates and outputs a reference clock signal with a predefined reference period length. In this context, the device for correcting at least one transmission parameter comprises an oscillator monitor which receives the sensor clock signal and the reference clock signal and carries out the method for correcting at least one transmission parameter.

The device for correcting at least one transmission parameter for data transmission between a sensor unit and a control unit can be understood here to be an evaluation and control unit which is arranged in the sensor unit and which processes and evaluates acquired sensor signals.

The evaluation and control unit can have at least one interface which can be embodied by means of hardware and/or software. In a hardware embodiment, the interfaces can be, for example, part of what is referred to as a system ASIC which includes a wide variety of functions of the evaluation and control unit, such as for example the function of the oscillator monitor. However, it is also possible for the oscillator monitor and/or the interfaces to be separate, integrated circuits or at least partially composed of discrete components. In the case of a software embodiment, the interfaces can be software modules which are present, for example, on a microcontroller along with other software modules. It is also advantageous to have a computer program product with program code which is stored on a machine-readable carrier such as a semiconductor memory, a hard disk memory or an optical memory and is used to carry out the evaluation when the program is executed by the evaluation and control unit.

A sensor unit is understood here to be a component which comprises at least one sensor element which directly or indirectly senses a physical variable or a change in a physical variable and preferably converts it into an electrical sensor signal. The sensor unit can therefore be embodied, for example, as an acceleration sensor or as a pressure sensor or as a rotational speed sensor with corresponding sensor elements. The sensor unit can be installed, for example, in a vehicle bumper in order to detect collisions with pedestrians. In order to detect side collisions, in one embodiment as an acceleration sensor the sensor unit can be installed on the B, C or D pillar of the vehicle, or in an embodiment as a pressure sensor it can be installed in the vehicle door. In order to detect front collisions, the sensor unit can be installed as an acceleration sensor in a central control unit or along a flexible crossmember of the vehicle. In order to detect rollovers or skidding, the sensor unit can be installed as a rotational speed sensor in the central control unit or in a separate housing on a vehicle center tunnel. The signals which are output by sensor units are further processed by algorithms within the control unit. If such an algorithm detects that a pedestrian impact, a side collision, a front collision or rollover has taken place, a triggering decision for active restraint means (e.g. airbag) is taken in the vehicle as a function of the detected accident scenario and this restraint means is activated in order to protect the pedestrian in the event of a pedestrian impact or the vehicle occupants in the event of a collision situation.

Advantageous improvements of the method for the correction of at least one transmission parameter for data transmission between a sensor unit and a control unit and the device for correcting at least one transmission parameter for data transmission between a sensor unit and a control unit are possible by virtue of the measures and developments disclosed in the dependent claims.

It is particularly advantageous that a correction factor can be calculated as a function of the deviation and can be applied to the at least one transmission parameter.

In one advantageous refinement of the method according to the disclosure, the at least one transmission parameter can be adapted in adjustable stages to the determined deviation. As a result, the adaptation of the at least one transmission parameter which can represent, for example, a transmission start time and/or a bit width does not take place suddenly but rather using a slow regulator. Such a slow regulator provides the advantage that the adaptation of the transmission parameters takes place slowly and not suddenly. The data transmission therefore becomes more stable. The adaptation of the transmission parameters takes place using the correction factor. The correction factor can be reduced, for example, by a set stage if the deviation is greater than a predefined threshold value. In addition, the correction factor can be increased by the set stage if the deviation is lower than the predefined threshold value. Furthermore, the correction factor can remain constant if the deviation is equal to the predefined threshold value. For example the value 0 can be predefined as the threshold value.

In one advantageous refinement, the device according to the disclosure can comprise a counter which counts pulses of the sensor clock signal. In this context, the oscillator monitor can start the counter at a start time at which the oscillator monitor receives a first synchronization pulse of the reference clock signal and stop the counter at a stop time at which the oscillator monitor receives a subsequent second synchronization pulse. The use of the counter permits particularly simple and cost-effective implementation of the device according to the disclosure for correcting at least one transmission parameter. Therefore, the oscillator monitor can read out a counter reading of the counter and compare it with a setpoint counter reading which is calculated from the ratio of the reference period length to the setpoint period length of the sensor clock signal. The setpoint counter reading can be calculated, for example, by the oscillator monitor or in advance and stored in a nonvolatile memory in the sensor unit. On the basis of the comparison, the oscillator monitor can determine a deviation of the current period length of the sensor clock signal from a setpoint period length.

In a further advantageous refinement of the device according to the disclosure, on the basis of a predefined tolerance range for the deviation, the oscillator monitor can calculate an acceptance window which can be limited downward by a first counter reading and upward by a second counter reading. The typical tolerances of the sensor clock signal are approximately ±3.5% over its service life. An upper limit for oscillator clock deviations in the individual sensor units is currently ±5% according to the PSI5 standard. The tolerance of the reference clock signal is ±1%. The acceptance window can therefore be predefined with an additional safety interval. Therefore, the acceptance window can be predefined, for example, with an outer limit of ±10%. The outer limit of the exemplary acceptance window results from the tolerance of the sensor oscillator of ±5%, the tolerance of the reference clock signal of ±1% and the safety interval which has, for example, a value of ±4%. The safety interval is selected such that the transmission of data into a triggering algorithm of restraint systems does not bring about any appreciable deviation of triggering times.

In a further advantageous refinement of the device according to the disclosure, the oscillator monitor can adapt the correction factor to the determined deviation and correct the at least one transmission parameter with the adapted correction factor if the current read-out counter reading lies within the acceptance window. Furthermore, the oscillator monitor can interpret the second synchronization pulse as a new first synchronization pulse and restart the counter if the current read-out counter reading lies within the acceptance window. In addition, the oscillator monitor can interpret the second synchronization pulse as an interference pulse if the corresponding current read-out counter reading is lower than the first counter reading. In this case, the oscillator monitor can ignore the second synchronization pulse which is interpreted as an interference pulse and not carry out any adaptation of the correction factor or correction of the at least one transmission parameter. Furthermore, the oscillator monitor can interpret the second synchronization pulse as a new first synchronization pulse if the corresponding current read-out counter reading is higher than the second counter reading. In this case, the oscillator monitor can restart the counter in reaction to the second synchronization pulse, which is interpreted as a new first synchronization pulse, and can correct the at least one transmission parameter with an already existing correction factor. As a result, in embodiments of the present disclosure the data transmission advantageously becomes even more robust with respect to EMC interference from the outside, which can give rise to artificial synchronization pulses or a lack of synchronization pulses. In addition, this can advantageously prevent a situation in which EMC interference can bring about a change in the correction factor.

One exemplary embodiment of the disclosure is illustrated in the drawing and is explained in more detail in the following description. In the drawing, identical reference symbols denote components and/or elements which execute the same or analogous functions.

DETAILED DESCRIPTION

Figure 1:
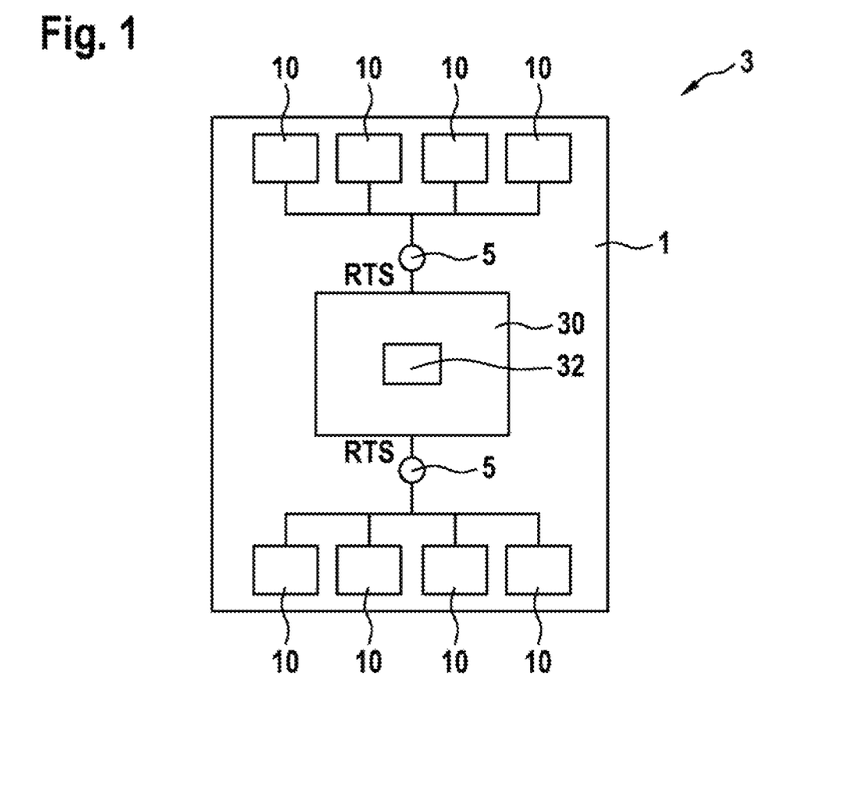
FIG. 1 shows a schematic block diagram of a sensor arrangement in a vehicle.
Figure 2:
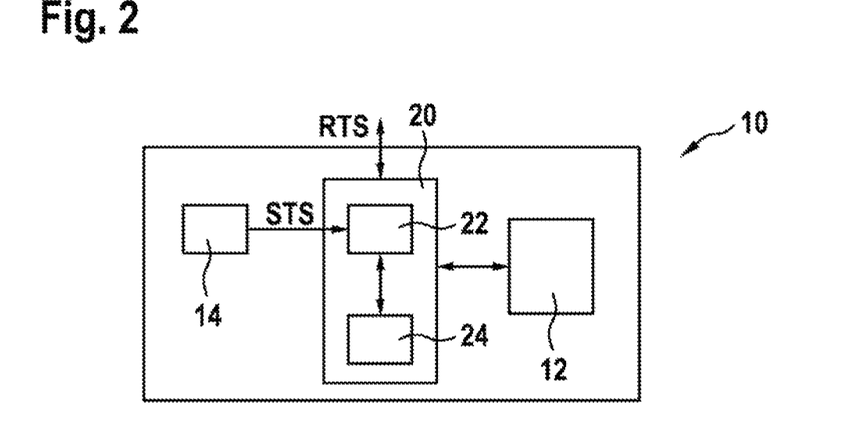
FIG. 2 shows a schematic block diagram of a sensor unit of the sensor arrangement from FIG. 1 having an exemplary embodiment of a device according to the disclosure for correcting at least one transmission parameter for data transmission between a sensor unit and a control unit.

As is apparent from FIGS. 1 and 2, a sensor arrangement 3 for a vehicle 1 in the illustrated exemplary embodiment comprises a control unit 30 with a reference oscillator 32 which generates and outputs a reference clock signal RTS with a predefined reference period length T_ref, a plurality of bus nodes 5, of which two bus nodes 5 are illustrated, and a plurality of sensor units 10, which are each embodied as peripheral airbag sensors and are connected to one of the bus nodes 5. In the illustrated exemplary embodiment, in each case four sensor units 10 are connected to one of the bus nodes 5. In the illustrated sensor arrangement 3, which is part of a personal protection system of the vehicle 1, the individual sensor units 10, bus nodes 5 and the control unit 30 are connected to one another via current-modulated two-wire buses and communicate by means of the PSI5 standard. As a result, the control unit 30 can receive and evaluate the pressure data or acceleration data or rotational speed data acquired by the sensor units 10.

As is also apparent from FIGS. 1 and 2, the individual sensor units 10 each comprise a sensor element 12, a sensor oscillator 14 which generates and outputs a sensor clock signal STS with a predefined period length T_STS, and a device 20 for correcting at least one transmission parameter for data transmission between a sensor unit 10 and a control unit 30. The at least one transmission parameter is determined on the basis of the sensor clock signal STS. In the illustrated exemplary embodiment, a first transmission parameter represents a transmission start time t_NS, and a second transmission parameter represents a bit width t_Bit.

In the illustrated exemplary embodiment, the device 20 for correcting at least one transmission parameter is embodied as an application-specific integrated circuit (ASIC) which comprises at least one computer unit or at least one microcontroller and processes and evaluates sensed sensor signals.

As is also apparent from FIG. 2, the device 20 for correcting at least one transmission parameter comprises an oscillator monitor 22 which receives the sensor clock signal STS and the reference clock signal RTS and carries out a method according to the disclosure for correcting at least one transmission parameter. In this context, the sensor clock signal STS is compared in a first step with the reference clock signal RTS, wherein on the basis of the comparison a deviation Delta_t of the current period length T_STS of the sensor clock signal STS from a setpoint period length T_STS_soll is determined, and wherein the at least one transmission parameter is corrected on the basis of the determined deviation Delta_t.

The method for correcting at least one transmission parameter can be implemented, for example, using software or hardware or in a mixed form from software and hardware in the individual sensor units 10.

In the illustrated exemplary embodiment, the reference clock signal RTS has a frequency of 2 kHz and a reference period length T_ref of 500 µs±1%. In the illustrated exemplary embodiment, the sensor clock signal STS has a frequency of 18 MHz and a setpoint period length T_STS_soll of 0.0555 µs. In order to detect the deviation Delta_t of the sensor clock signal STS of the sensor unit relative to the reference clock signal RTS of the control unit 30, the deviation Delta_t is therefore calculated according to equation (1).

$$Delta\_t = T\_ref - N * T\_STS \text{ where } N = T\_ref/T\_STS\_soll \quad (1)$$

Figure 3:
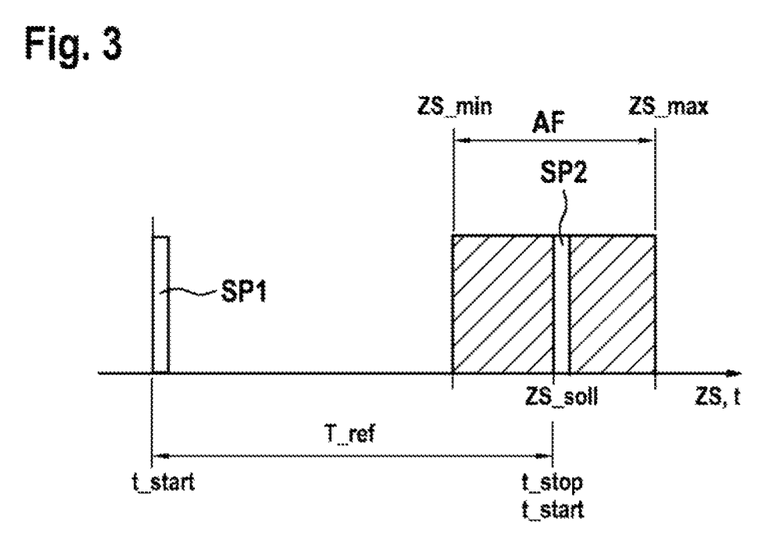
FIG. 3 shows a schematic illustration of a first timeline for a method according to the disclosure for correcting at least one transmission parameter, wherein a second synchronization pulse is received within an acceptance window.
Figure 4:
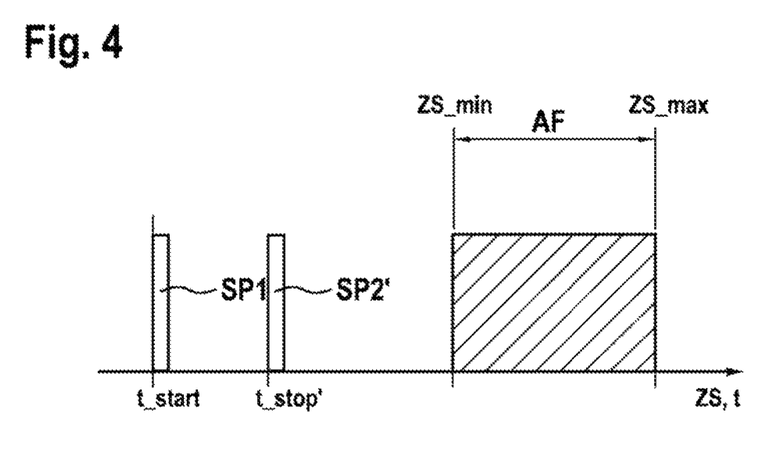
FIG. 4 shows a schematic illustration of a second timeline for the method according to the disclosure for correcting at least one transmission parameter, wherein the second synchronization pulse is received before the acceptance window.
Figure 5:
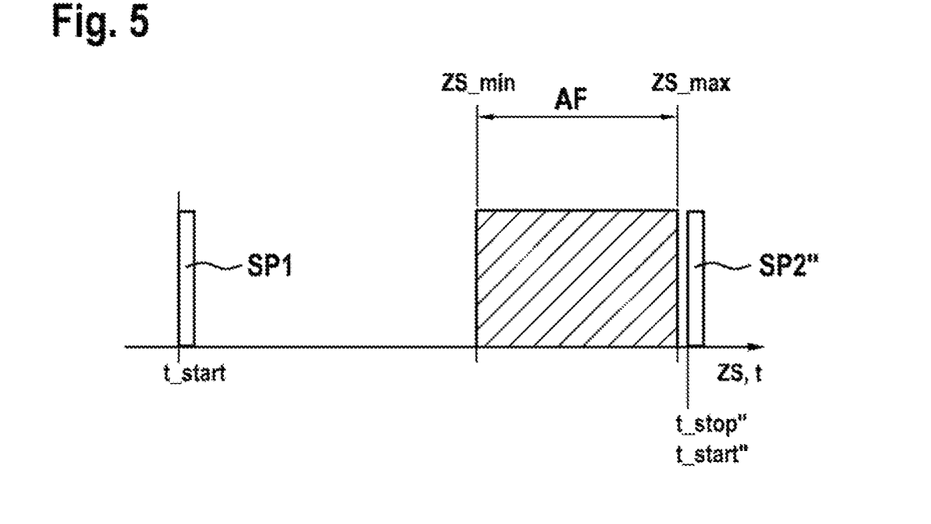
FIG. 5 shows a schematic illustration of a third timeline for the method according to the disclosure for correcting at least one transmission parameter, wherein the second synchronization pulse is received after the acceptance window.

For the values as specified above, a value of 9000 is obtained for the factor N. In a further step, proportional adaptation of the transmission start time t_NS based on the PSI5 standard and of the bit widths t_Bit is carried out as a function of the deviation Delta_t of the sensor clock signal STS and the reference clock signal RTS in the respective sensor unit 10 before data transmission. In this way, a data collision does not occur on the PSI5 transmission bus even if the sensor clock signal STS of the sensor unit 10 can deviate by up to ±10% from the nominal case in the illustrated exemplary embodiment. The typical tolerances of the sensor clock signal STS are ±3.5% over the service life. The permitted upper limit for deviations of the sensor clock signal STS in the respective sensor unit 10 is ±5% according to the PSI5 standard. In the illustrated exemplary embodiment, the range for the correction of the at least one transmission parameter starts at a deviation Delta_t of ±0% and ends at a deviation Delta_t of approximately ±10%. This also corresponds to an acceptance window AF which is illustrated in FIGS. 3 to 5 and in which the respective sensor unit 10 accepts the second synchronization pulse SP2 of the control unit 30 as valid. The outer limit of ±10% for the deviation Delta_t results from the tolerance of ±5% for the sensor clock signal STS which is permitted according to the PSI5 standard, from a tolerance of ±1% of the reference clock signal RTS and from a safety interval of ±4% here. The safety interval has been selected such that transmission of data in an airbag algorithm does not give rise to any appreciable deviation of triggering times.

The deviation adaptation of the transmission start times t_NS and of the bit widths t_Bit does not take place suddenly within the scope of the disclosure but rather using a slow regulating function. Such a slow regulating function provides the advantage that the adaptation of the transmission start times t_NS and of the bit widths t_Bit takes place slowly and not suddenly. The data transmission therefore becomes more stable. In order to permit transient recovery of the regulating function within a first initialization phase of the sensor unit 10 and therefore already to ensure fault free data transmission of sensor status data in a second initialization phase, a minimum regulating speed in the first initialization phase is set to at least 60%/s. In this context, the first initialization phase lasts at least 50 ms. The control unit 30 starts the transmission of the reference clock signal RTS approximately 10 ms after the switching on. For the transient recovery of the reference clock signal RTS, a further 5 ms are provided. Therefore, in the first initialization phase 35 ms or 70 synchronization pulses SP1, SP2 are still available for the transient recovery of the regulating function. With the lowest regulating rate of 2%/0.035 s, a regulating rate of 57.1%/s is obtained.

With a maximum permitted deviation Delta_t of the sensor clock signal STS of 5%, a regulating rate of 57.1%/ s*1.05%=60.0%/s is obtained. After the first initialization phase, the regulating function for the transmission start times t_NS and bit widths t_Bit is operated more slowly. For this purpose, various regulating rates RR can be stored in a memory (not illustrated in more detail). For example the following values for the regulating rate RR: ±0.0625%/s, ±0.03215%/s, ±0.125%/s, ±0.25%/s, ±0.5%/s, ±1%/s, ±2%/s, ±4%/s are stored for the illustrated exemplary embodiment.

The adaptation of the at least one transmission parameter or of the transmission start times t_NS and of the bit widths t_Bit to the determined deviation Delta_t takes place using a correction factor KF in adjustable stages.

This means that the correction factor KF is obtained over time as a stage (KF=ΣRR) as a function of the set regulating rate RR. In this context, the correction factor KF is reduced by the set regulating rate RR if the determined deviation Delta_t is greater than a predefined setpoint value of, for example 0. If the determined deviation Delta_t is lower than the predefined setpoint value, the correction factor KF is increased by the regulating rate RR. If the determined deviation Delta_t is equal to the predetermined setpoint value, the correction factor KF is not changed and remains constant.

The correction factor KF is applied according to equation (2) to the transmission start time t_NS, and according to equation (3) to the bit width t_Bit.

$$t\_NS, KF = (KF * t\_NS) + t\_NS \quad (2)$$

$$t\_Bit, KF = (KF * t\_Bit) + t\_Bit \quad (3)$$

In the illustrated exemplary embodiment, the device 20 for correcting at least one transmission parameter comprises a counter 24 which counts pulses of the sensor clock signal STS. The method of functioning of the device 20 for correcting at least one transmission parameter from FIG. 2 is described below with reference to FIGS. 3 to 5. The oscillator monitor 22 starts the counter 24 at a start time t_start, t_start", at which the oscillator monitor 22 receives a first synchronization pulse SP1 of the reference clock signal RTS. The oscillator monitor 22 stops the counter 24 at a stop time t_stop, t_stop', t_stop", at which the oscillator monitor 22 receives a subsequent second synchronization pulse SP2, SP2', SP2". The oscillator monitor 22 then reads out a counter reading ZS from the counter 24 and compares it with a setpoint counter reading ZS_soll, which is calculated from the ratio of the reference period length T_ref to the setpoint period length T_STS_soll of the sensor clock signal STS. With the abovementioned values a setpoint counter reading ZS_soll of 9000 is obtained. Therefore, the oscillator monitor 22 can determine the deviation Delta_t of the current period length T_STS of the sensor clock signal STS from the setpoint period length T_STS_soll on the basis of a comparison of the setpoint counter reading ZS_soll and of the current counter reading ZS, according to the equation (4).

$$Delta\_t = (ZS\_soll - ZS) * T\_STS\_soll \quad (4)$$

On the basis of the predefined tolerance range of ±10% for the deviation Delta_t, the oscillator monitor 22 calculates the acceptance window AF which is limited downward by a first counter reading ZS_min of 8100 here, and upward by a second counter reading ZS_max of 9900 here. The oscillator monitor 22 corrects the at least one transmission parameter on the basis of the determined deviation Delta_t if the current read-out counter reading ZS lies within the acceptance window AF.

As is also apparent from FIG. 3, the oscillator monitor 22 receives the first synchronization pulse SP1 at the start time t_start and starts the counter 24. At the stop time t_stop, the oscillator monitor 22 receives the second synchronization pulse SP2 within the acceptance window AF. This means that the current read-out counter reading ZS lies between the first counter reading ZS_min of 8100 here and the second counter reading ZS_max of 9900 here. The oscillator monitor 22 therefore interprets the two synchronization pulses SP1, SP2 as a valid synchronization pulse pair. Therefore, the oscillator monitor 22 adapts the correction factor KF to the determined deviation Delta_t and corrects the at least one transmission parameter with the adapted correction factor pair. In addition, the oscillator monitor 22 interprets the second synchronization pulse SP2 as a new first synchronization pulse SP1 and restarts the counter 24 if the current read-out counter reading ZS lies within the acceptance window AF. Since FIG. 3 exhibits an optimum state with a deviation Delta_t of 0, the current read-out counter reading ZS corresponds to the setpoint counter reading ZS_soll, so that the correction factor KF used remains constant.

As is also apparent from FIG. 4, the oscillator monitor receives the first synchronization pulse SP1 at the start time t_start and starts the counter 24. At the stop time t_stop', the oscillator monitor 22 receives the second synchronization pulse SP2' outside the acceptance window AF. In the illustration according to FIG. 4, the read-out counter reading ZS lies below the first counter reading ZS_min of 8100 here. Therefore, the oscillator monitor 22 interprets the second synchronization pulse SP2' as an interference pulse, and the two synchronization pulses SP1, SP2' as an invalid synchronization pulse pair. Since in this case the pulse is an interference pulse, it is ignored by the oscillator monitor 22, and the correction factor KF is not adapted and the at least one transmission parameter is not corrected. In addition, after the second synchronization pulse SP2' data is not transmitted to the control unit 30.

As is also apparent from FIG. 5, the oscillator monitor receives the first synchronization pulse SP1 at the start time t_start and starts the counter 24. At the stop time t_stop", the oscillator monitor 22 receives the second synchronization pulse SP2" outside the acceptance window AF. In the illustration according to FIG. 5, the read-out counter reading ZS lies above the second counter reading ZS_max of 9900 here. In this case, the received second synchronization pulse SP2" is accepted by the oscillator monitor 22. However, the oscillator monitor 22 interprets the second synchronization pulse SP2" as a new first synchronization pulse SP1. This means that the second synchronization pulse SP2" serves as a new start time t_start for the reference clock measurement or for the counter 24 in the sensor unit 10. However, the already existing correction factor KF remains unchanged and the oscillator monitor 22 corrects the at least one transmission parameter with the already existing correction factor KF.

Embodiments of the disclosure provide the further advantage that the data transmission becomes even more robust with respect to EMC interference from the outside. Finally, no adaptation of the correction factor is to be carried out in the case of EMC interference.

The invention claimed is:

1. A method for correcting at least one transmission parameter for data transmission between a sensor unit and a control unit, comprising:
   generating a sensor clock signal with a predefined period length with a sensor oscillator;

determining the at least one transmission parameter based on the sensor clock signal;
generating a reference clock signal with a reference oscillator with a predefined reference period length;
receiving the reference clock signal;
comparing the sensor clock signal with the reference clock signal;
determining a deviation of a current period length of the sensor clock signal from a setpoint period length based on the comparison; and
correcting the at least one transmission parameter based on the determined deviation.

2. The method as claimed in claim 1, further comprising:
calculating a correction factor as a function of the determined deviation; and
applying the correction factor to the at least one transmission parameter.

3. The method as claimed in claim 2, further comprising:
adapting the at least one transmission parameter in adjustable stages to the determined deviation.

4. The method as claimed in claim 3, further comprising:
reducing the correction factor by a set stage when the determined deviation is greater than a predefined threshold value;
increasing the correction factor by the set stage when the determined deviation is smaller than the predefined threshold value; and
maintaining the correction factor without change when the determined deviation is equal to the predefined threshold value.

5. The method as claimed in claim 1, wherein the at least one transmission parameter represents a transmission start time and/or a bit width.

6. A device for correcting at least one transmission parameter for data transmission between a sensor unit and a control unit, comprising:
a sensor oscillator configured to generate and to output a sensor clock signal with a predefined period length, wherein the at least one transmission parameter is determined based on the sensor clock signal;
a reference oscillator configured to generate and to output reference clock signal with a predefined reference period length; and
an oscillator monitor configured to receive the sensor clock signal and the reference clock signal and to correct at least one transmission parameter by (i) comparing the sensor clock signal with the reference clock signal, (ii) determining a deviation of a current period length of the sensor clock signal from a setpoint period length based on the comparison, and (iii) correcting the at least one transmission parameter based on the determined deviation.

7. The device as claimed in claim 6, further comprising:
a counter configured to count pulses of the sensor clock signal,
wherein the oscillator monitor is configured to start the counter at a start time at which the oscillator monitor receives a first synchronization pulse of the reference clock signal and to stop the counter at a stop time at which the oscillator monitor receives a subsequent second synchronization pulse.

8. The device as claimed in claim 7, wherein the oscillator monitor is configured to read out a counter reading of the counter and to compare the counter reading with a setpoint counter reading which is calculated from a ratio of the predetermined reference period length to the setpoint period length of the sensor clock signal.

9. The device as claimed in claim 8, wherein the oscillator monitor is configured, on the basis of a predefined tolerance range for the determined deviation, to calculate an acceptance window which is limited downward by a first counter reading and upward by a second counter reading.

10. The device as claimed in claim 9, wherein the oscillator monitor is configured to adapt a correction factor to the determined deviation and to correct the at least one transmission parameter with the adapted correction factor when a current read-out counter reading lies within the acceptance window.

11. The device as claimed in claim 10, wherein the oscillator monitor is configured to interpret the second synchronization pulse as a new first synchronization pulse and to restart the counter when the current read-out counter reading lies within the acceptance window.

12. The device as claimed in claim 10, wherein the oscillator monitor is configured to interpret the second synchronization pulse as an interference pulse when the corresponding current read-out counter reading is lower than the first counter reading.

13. The device as claimed in claim 12, wherein the oscillator monitor is configured to ignore the second synchronization pulse which is interpreted as an interference pulse, and to not carry out any adaptation of the correction factor, and to not carry out any correction of the at least one transmission parameter.

14. The device as claimed in claim 10, wherein the oscillator monitor is configured to interpret the second synchronization pulse as a new first synchronization pulse when the corresponding current read-out counter reading is higher than the second counter reading.

15. The device as claimed in claim 14, wherein in reaction to the second synchronization pulse which is interpreted as a new first synchronization pulse, the oscillator monitor is configured to restart the counter and to correct the at least one transmission parameter with an already existing correction factor.

* * * * *

UNITED STATES PATENT AND TRADEMARK OFFICE
CERTIFICATE OF CORRECTION

PATENT NO. : 10,972,250 B2
APPLICATION NO. : 16/753063
DATED : April 6, 2021
INVENTOR(S) : Walz et al.

Page 1 of 1

It is certified that error appears in the above-identified patent and that said Letters Patent is hereby corrected as shown below:

In the Claims

Claim 6, Column 9, Line 47: "correct at least one transmission parameter" should read --correct the at least one transmission parameter--.

Signed and Sealed this
Thirteenth Day of July, 2021

Drew Hirshfeld
*Performing the Functions and Duties of the
Under Secretary of Commerce for Intellectual Property and
Director of the United States Patent and Trademark Office*